US012572771B2

(12) United States Patent
Ali et al.

(10) Patent No.: US 12,572,771 B2
(45) Date of Patent: Mar. 10, 2026

(54) METAL SMARTCARD, AND METHOD FOR MANUFACTURING A METAL SMARTCARD

(71) Applicant: IDEMIA FRANCE, Courbevoie (FR)

(72) Inventors: Ahmed Ali, Courbevoie (FR); Tiphaine Groult, Courbevoie (FR)

(73) Assignee: IDEMIA FRANCE, Courbevoie (FR)

( * ) Notice: Subject to any disclaimer, the term of this patent is extended or adjusted under 35 U.S.C. 154(b) by 0 days.

(21) Appl. No.: 18/978,145

(22) Filed: Dec. 12, 2024

(65) Prior Publication Data

US 2025/0200321 A1      Jun. 19, 2025

(30) Foreign Application Priority Data

Dec. 14, 2023    (FR) ........................................ 2314241

(51) Int. Cl.
*G06K 19/06*       (2006.01)
*G06K 19/077*      (2006.01)
*H05K 1/02*        (2006.01)

(52) U.S. Cl.
CPC . *G06K 19/07722* (2013.01); *G06K 19/07773* (2013.01); *H05K 1/0237* (2013.01); *H05K 2201/10098* (2013.01)

(58) Field of Classification Search
CPC ......... G06K 19/07749; G06K 19/0723; G06K 19/07773; G06K 19/07722; G06K 19/07747; G06K 19/07; G06K 19/07775; H05K 1/0237
USPC .................................................. 235/492, 487
See application file for complete search history.

(56) References Cited

U.S. PATENT DOCUMENTS

2017/0308785 A1    10/2017    Kim et al.
2018/0232617 A1     8/2018    Kim et al.
2020/0125913 A1     4/2020    Kim et al.
2020/0257953 A1 *   8/2020    Lotya ............... G06K 19/07794
2023/0067229 A1     3/2023    Ali et al.
2023/0237305 A1     7/2023    Mendez et al.
2024/0028860 A1 *   1/2024    Finn ................. G06K 19/07722
2024/0320461 A1 *   9/2024    Katano ............ G06K 19/07749

FOREIGN PATENT DOCUMENTS

WO      WO 2017/191373 A1    11/2017

OTHER PUBLICATIONS

French Preliminary Search Report and Written Opinion dated Aug. 12, 2024 in FR2314241 filed on Dec. 14, 2023, 10 pages.

* cited by examiner

*Primary Examiner* — Daniel St Cyr
(74) *Attorney, Agent, or Firm* — Oblon, McClelland, Maier & Neustadt, L.L.P.

(57)                ABSTRACT

A smartcard having a metal layer having an RF antenna arranged in or opposite a recess region, a module having an RF chip, and a conductive-material pattern that is arranged in or opposite the recess region and includes a central region and at least two conductive-material traces that are separated and remote from one another, in order to allow a magnetic field to pass through said antenna, and configured so as not to form a closed loop, said conductive-material pattern being configured to form a capacitance that is electrically connected to the antenna, the value of which is determined so that the capacitance formed by said pattern, which is associated with the capacitance of said antenna, allows the resonant circuit formed by the antenna and said pattern to resonate at a determined communication frequency.

20 Claims, 6 Drawing Sheets

Fig. 9

```
┌─────────────────┐
│  Form the card  │─────── S2
│      body       │
└─────────────────┘
         │
         ▼
┌─────────────────┐
│ Form the antenna│─────── S4
└─────────────────┘
         │
         ▼
┌─────────────────┐
│ Form the pattern│─────── S6
└─────────────────┘
         │
         ▼
┌─────────────────┐
│  Assemble RF    │─────── S8
│     module      │
└─────────────────┘
         │
         ▼
┌─────────────────┐
│ Deposit the resin│────── S10
└─────────────────┘
```

METAL SMARTCARD, AND METHOD FOR MANUFACTURING A METAL SMARTCARD

TECHNICAL FIELD

The invention relates to the field of smartcards and is concerned more particularly with metal smartcards capable of operating in contactless mode.

PRIOR ART

The use of smartcards (or microcircuit cards) is widespread in daily life nowadays. Such cards are used for example as bank cards, loyalty cards, access cards, etc., and can have various formats depending on their respective uses. Smartcards can be designed to perform various types of functions, in particular to perform transactions, such as bank transactions (payment transaction, transfer transaction, etc.), authentication transactions, etc.

As is known, a smartcard generally comprises a card body that is equipped with an electronic chip configured to exchange signals with the outside and to perform various functions depending on the desired use of the card. To do this, smartcards are fitted with communication means allowing interaction with the outside, typically with an NFC reader or external reader.

Traditionally, a smartcard is designed to cooperate with an external NFC reader by means of external contacts that are accessible on the surface of the card. An external NFC reader can thus position appropriate contact pins on the external contacts of the card in order to set up a contact-based communication.

More recently, contactless smartcards have gained increasing momentum owing to the benefits of speed and simplicity associated with contactless transactions. To do this, contactless cards incorporate a radio-frequency (RF) antenna allowing RF signals to be exchanged with an external NFC reader (for example in the near field, NFC (Near Field Communication)). This RF antenna is generally made up of a plurality of conductive coils that extend in the body of the card.

The structure and appearance of smartcards can vary as appropriate. Metal smartcards are becoming increasingly sought-after, in particular, notably due to the attractive aesthetic looks of these cards (metallic glints, brushed surface effect, etc.), the impression of quality that they are able to give (significant weight of the metal, high-end aesthetics), or else the prestigious connotation associated therewith for their users. In particular their great weight and the impression of high quality that they exude mean that these cards are favoured by some users to serve as a status symbol and a distinguishing feature.

However, it has been found that the presence of metal in the body of a smartcard presents major difficulties when the card incorporates an RF antenna in order to operate in contactless mode. The metal acts as an electromagnetic screen and blocks or hampers RF signals exchanged by the RF antenna with the outside. The metal present in the card body can thus disrupt contactless communication by a smartcard with an external NFC reader and for example hamper the performance of a contactless (payment or other) transaction.

A known solution involves using a layer of ferrite between the antenna and the sheet of metal. Although simple, this solution complicates manufacture of the card and the card is able to communicate with the interrogating reader on one side only.

Another relevant solution involves using an antenna of reduced size inserted inside or so as to overlap a cavity (absence of metal) produced in a sheet of metal, the cavity being connected to the outside edge of the layer of metal by means of a slit. In this configuration, the metal layer surrounds the NFC antenna and therefore has a larger physical surface than that of the antenna and generally takes up the whole size of the card.

As magnetic field lines are closed lines, the interrogating magnetic field incident on the surrounding metal layer will, in such a topology, therefore be diverted from the metal: the magnetic field lines at the periphery of the metal will be diverted towards the outside, while the lines close to the cavity will be diverted towards the inside, thus passing through the region of the antenna and being added to the normal magnetic flux passing through the antenna, making the effective region thereof larger than if it had been used without this surrounding metal.

Although the technique described hereinabove exhibits good NFC behaviour, it can suffer from one major technical problem. As the antenna insert is made up of a printed circuit, this circuit is implemented using conventional printed circuit technology on a dielectric substrate such as, for example, the material FR4. The antenna traces in this case are produced using a conventional subtractive PCB process (mechanical or chemical etching) with optional electroplated or electrolysis-free metal growth in order to achieve a certain thickness. The conventional process for manufacturing the card therefore comprises at least one process of filling the region of the cavity situated above the antenna in order to provide a seal between these two mechanically different elements, that is to say the substrate of the printed circuit and the metal strip that surrounds it. This sealing step is essential in order to provide the whole product with a monolithic appearance with a view to catering to a certain aesthetic look, but especially to provide the card with mechanical stability by preventing it from tearing during the various bending cycles throughout the life of the product.

A major problem stands in the way of this sealing/resin process achieving success and playing the part described hereinabove: as the NFC antenna is routed in the form of typical closed loops, the central region of the antenna of the printed circuit is completely devoid of metal, while the turns of the antenna at the periphery carry the turns of the antenna. This creates a structural asymmetry on the surface of the printed circuit for the two sides of the circuit. This lack of homogeneity gives rise to a lack of adhesion and, therefore, a lack of the intended monolithic appearance and, finally, a fragility for the whole card. Moreover, the larger the cavity, the more serious this problem.

There is thus a need for powerful easy-to-manufacture metal smartcards (for example of RFID type) that are capable of effectively cooperating contactlessly with an external terminal.

SUMMARY OF THE INVENTION

The present invention relates to a smartcard comprising:
- a card body formed at least in part by a metal layer comprising a recess region and at least two plastics layers on either side of the metal layer;
- at least one RF antenna arranged in or opposite the recess region;

a module comprising an RF chip, the module being positioned in a cavity that passes through a plastics layer and being electrically connected to the RF antenna;

a conductive-material pattern that is connected in parallel with said at least one antenna and arranged in or opposite the recess region and comprises a central region, the conductive surface area of which is less than or equal to 20% of the surface area of a central region contained by said antenna at least two conductive-material traces ($T_i$) that are separated from one another and extend from said central region of said pattern, said at least two conductive-material traces being remote from one another in order to allow a magnetic field to pass through said antenna and being configured so as not to form a closed loop, in order to prevent the formation of Foucault currents on said card, said conductive-material pattern being configured to form a capacitance that is electrically connected to the antenna, the value of which is determined so that the capacitance formed by said pattern, which is associated with the capacitance of said antenna, allows the resonant circuit formed by the antenna and said pattern to resonate at a determined communication frequency.

Inserting a conductive-material pattern into a region included at the centre of the antenna allows the robustness of the metal smartcard to be improved by adding a metal region to a cavity that did not hold a metal region and that was thus a region whose structure was different from the structure provided by the metal layer present outside the cavity. As the pattern is made of conductive material, it moreover allows an additional capacitance to be provided.

According to some embodiments, said antenna comprises two RF windings (AT1, AT2) that are electrically connected to one another and respectively situated on either side of said recess region, two conductive-material patterns being respectively situated on either side of said recess region and each connected to one of the RF windings.

The two conductive-material patterns can thus form a parallel capacitance, and allow the capacitive value of the whole resonant circuit formed by the pattern and the antenna to be improved.

According to some embodiments, said determined communication frequency is 13.56 MHz and conforms to the standard ISO 14443-2 or ISO 10373-6.

According to some embodiments, the at least one antenna comprises a plurality of coils, the central region of said pattern is round and centred on the centre of the coils of the antenna, and the traces of said pattern are circular traces centred on the centre of the coils and forming rings around the round central region of the pattern, the traces each being separated from one another by first nonconductive circular regions extending between each of the circular traces and a second rectilinear region connecting said first nonconductive circular regions and interrupting each of the conductive circular traces of said pattern so as not to form a closed loop, in order to prevent the formation of Foucault currents on said card, the first nonconductive circular regions each being open so as to ensure a conductive continuity between the central region and the traces of said pattern.

According to some embodiments, the at least one antenna comprises a plurality of coils, said conductive-material pattern comprises a round conductive central surface centred on the centre of the coils of the antenna and interconnecting a plurality of said pairs of conductive-material traces, said conductive-material traces being rectangular, connected to said conductive central surface by one of their ends, the other end being free, and uniformly distributed around said central region of the pattern.

According to some embodiments, the at least one antenna comprises a plurality of coils, said conductive-material pattern comprises a round conductive central surface centred on the centre of the coils of the antenna and interconnecting a plurality of said pairs of conductive-material traces, said conductive-material traces being helical, connected to said conductive central surface by one of their ends, the other end being free, and uniformly distributed around said central region of the pattern.

According to some embodiments, the conductive-material traces are uniformly distributed around the round central surface.

According to some embodiments, the number of conductive traces depends on the value of the connected capacitance.

According to some embodiments, the traces have a width that is configured to reduce the Foucault currents present on said smartcard.

According to another aspect, the present invention relates to a method for manufacturing a smartcard (CD1) that is formed at least in part by a card body comprising a metal layer (103), said metal layer comprising a recess region (104), the method comprising:

a) forming (S4), on or in the card body, at least one first RF antenna (AT1, AT2) in or opposite the recess region of the metal layer;

b) forming (S6) at least one conductive-material pattern at the centre of the at least one antenna connected in parallel with said at least one antenna and arranged in or opposite the recess region, the metal pattern comprising a central region, the conductive surface area of which is less than or equal to 20% of the surface area of a central region contained by said antenna at least two conductive-material traces ($T_i$) that are separated from one another and extend from said central region of said pattern, said at least two metal traces being remote from one another in order to allow a magnetic field to pass through said antenna and being configured so as not to form a closed loop, in order to prevent the formation of Foucault currents on said card, said conductive-material pattern being configured to form a capacitance that is electrically connected to the antenna, the value of which is determined so that the capacitance formed by said pattern, which is associated with the capacitance of said antenna, allows the resonant circuit formed by the antenna and said pattern to resonate at a determined communication frequency c) assembling (S8) an RF chip so that said RF chip is electrically connected to said at least one antenna, d) depositing (S10) a layer of resin in order to seal the metal layer and the recess region comprising said at least one antenna and said at least one metal pattern.

Other features and advantages of the present invention will emerge from the description provided hereinbelow, with reference to the appended drawings, which illustrate an exemplary embodiment thereof that is devoid of any limiting nature.

BRIEF DESCRIPTION OF THE DRAWINGS

FIG. 9 shows a method for manufacturing a smartcard according to some embodiments of the invention.

DESCRIPTION OF THE EMBODIMENTS

Figure 1A:
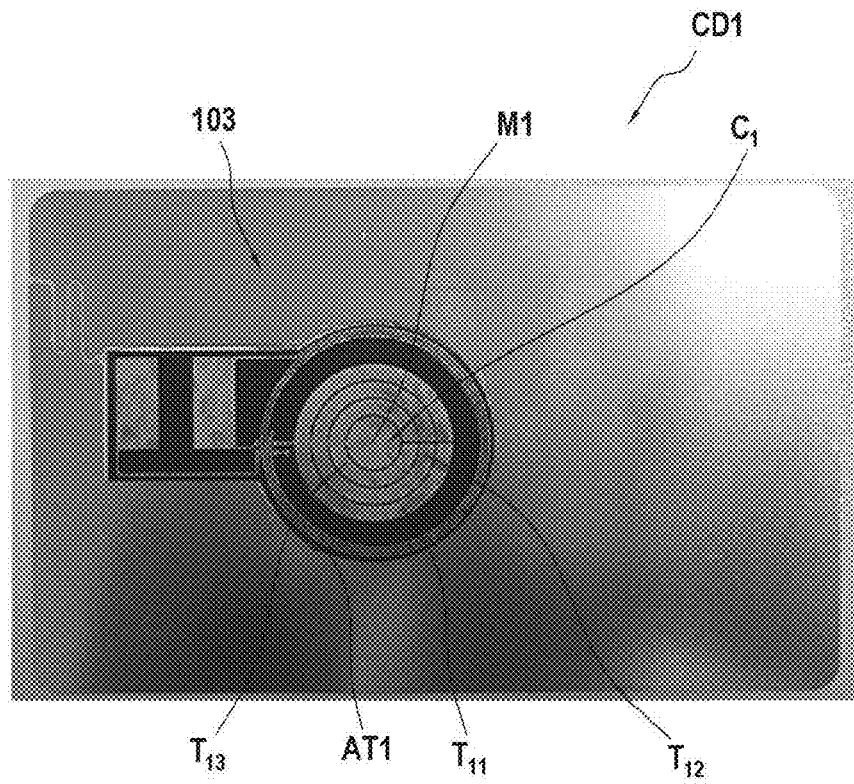
FIG. 1a shows a view of the front face of a smartcard according to some embodiments of the invention.

As indicated previously, the invention concerns metal smartcards configured to operate in contactless mode, and also relates to a method for manufacturing such smartcards. A "metal smartcard", in the present document, denotes a smartcard comprising a metal or a combination (alloy) of metals, for example in the form of a metal layer or a plurality of metal layers.

As indicated previously, a contactless smartcard is by nature configured to communicate contactlessly with the outside, more particularly with an external NFC reader. To this end, a contactless smartcard incorporates a radio-frequency (RF) antenna to exchange (receive and/or transmit) RF signals with an external NFC reader. Such a smartcard may moreover have the ability to also operate in contact-based mode, by using external contacts provided for this purpose on the surface of the card: the term "dual" (or dual communication interface cards) is then used, these cards thus being capable of operating in contactless mode and in contact-based mode.

Today there is a high demand among users for metal smartcards, particularly for the reasons set out previously (aesthetic looks, impression of quality, prestige, and so on). It is in particular desirable to produce smartcards in which the bulk (or a large part) of the card body is made of metal, or at least in which the card body comprises a metal plate (or metal layer), in order to obtain a certain uniformity and quality in the visual and aesthetic appearance of the card.

As mentioned previously, when the antenna has a central region devoid of metal, the surface of the card has a structural asymmetry due to the fact that metal is distributed inhomogeneously over the card, the central region of the antenna of the printed circuit being completely devoid of metal, while the turns of the antenna at the periphery carry the turns of the antenna. This creates a structural asymmetry on the surface of the printed circuit for the two sides of the circuit. To better understand the problem, according to some embodiments, the antenna coils generally have a thickness greater than 30 μm and can attain 90 μm, which can therefore disrupt the homogeneity of the sealing material at the surface of the printed circuit.

In this presentation, examples of implementations of the invention are described in connection with a smartcard of "dual" type, that is to say a dual communication interface card, that is able to communicate just as well in contact-based mode (via external contacts) as in contactless mode (via an RF antenna structure). However, it will be noted that the invention can apply more generally to any smartcard configured to communicate contactlessly, regardless of whether or not it has the ability to operate in contact-based mode as well.

Furthermore, in the examples that follow, the smartcard is considered to be a bank card, such as a payment card, for example. This smartcard may conform to the standard ISO 7816 and can operate according to the EMC standard, although neither one nor the other of these aspects is obligatory in order to implement the invention. More generally, the invention applies to any metal smartcard configured to implement a transaction in contactless mode, including EMC cards or smartcards using another transaction standard, for example the NFC standard (based, for example, on ISO14443-2, ISO 10373-6, "EMC Contactless Certification"). Generally, the smartcard of the invention may be configured to perform a transaction of any type, such as bank transactions (payment transactions, transfer transactions, debit transactions, and so on), authentication transactions, etc.

Unless stated otherwise, common or similar elements in multiple figures bear the same reference signs and have identical or similar features, and so these common or similar elements are generally not described again for the sake of simplicity.

The terms "first", "second", etc., are used in this document by arbitrary convention to allow different elements (such as keys, devices, etc.) implemented in the embodiments described below to be identified and distinguished.

Figure 1B:
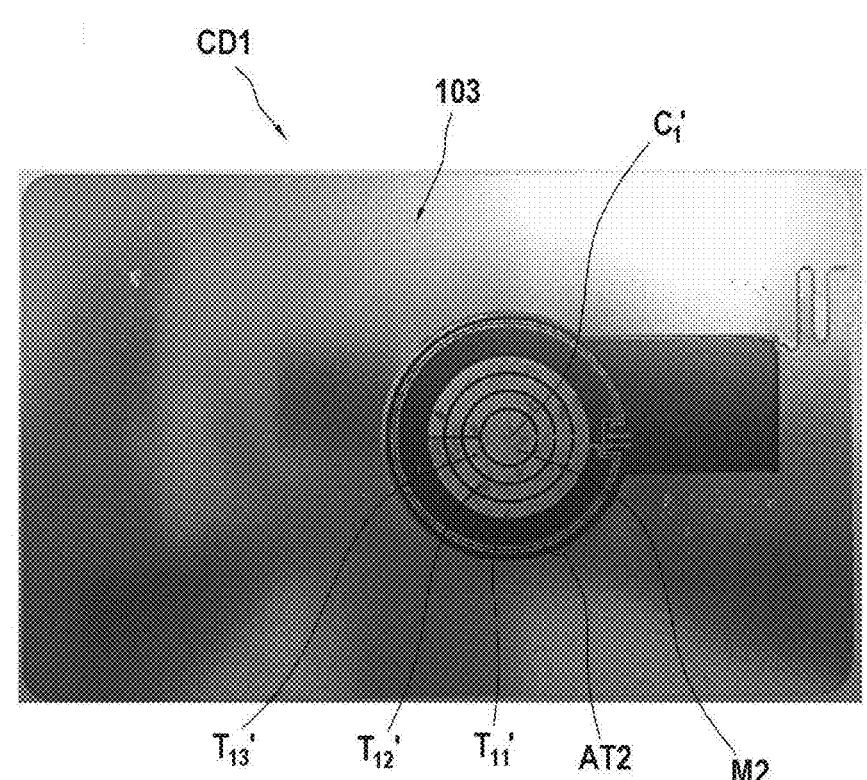
FIG. 1b shows a view of the rear face of a smartcard according to some embodiments of the invention.

FIGS. 1a and 1b show a view of the front face and a view of the rear face of a smartcard CD1 according to an embodiment of the present invention. If FIG. 1a shows a view of the front face, FIG. 1b shows a view of the rear face, and vice versa. The embodiment in FIGS. 1a and 1b is subsequently described in more detail in FIGS. 2a and 2b and in FIG. 3.

The smartcard CD1 as shown in the embodiment in FIGS. 1a and 1b comprises a metal layer 103, a first antenna winding AT1 and a second antenna winding AT2. The two antenna windings AT1 and AT2 are electrically connected by way of vias or metal perforations. The card CD1 also comprises a pattern M1 and a pattern M2, which are situated at the centre of the antenna. The two patterns M1 and M2 are electrically connected by way of vias or metal perforations. These two patterns are each also electrically connected to the antenna.

Figure 2A:
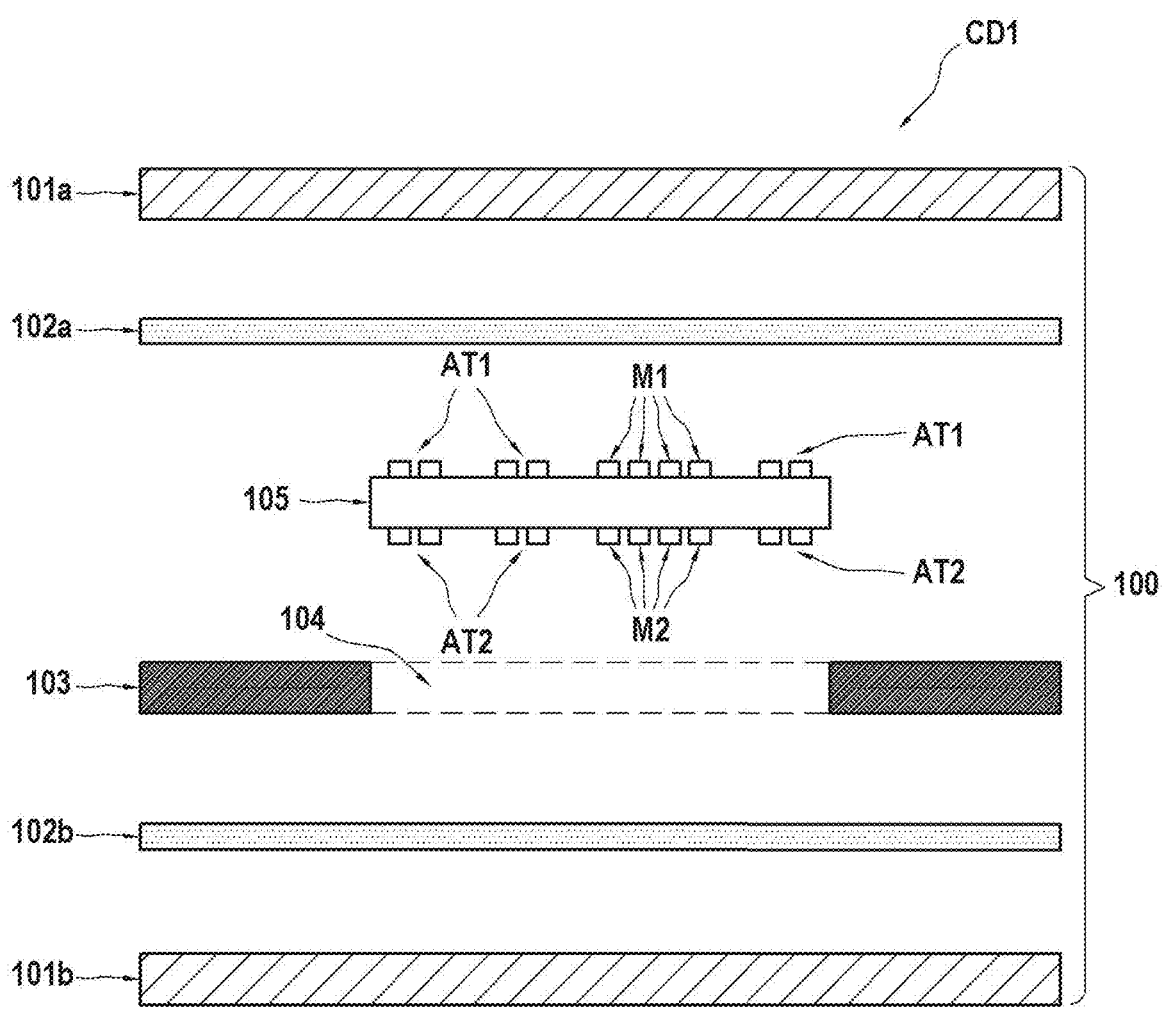
FIG. 2a shows a side view of the unassembled layers of a smartcard according to some embodiments of the invention.
Figure 2B:
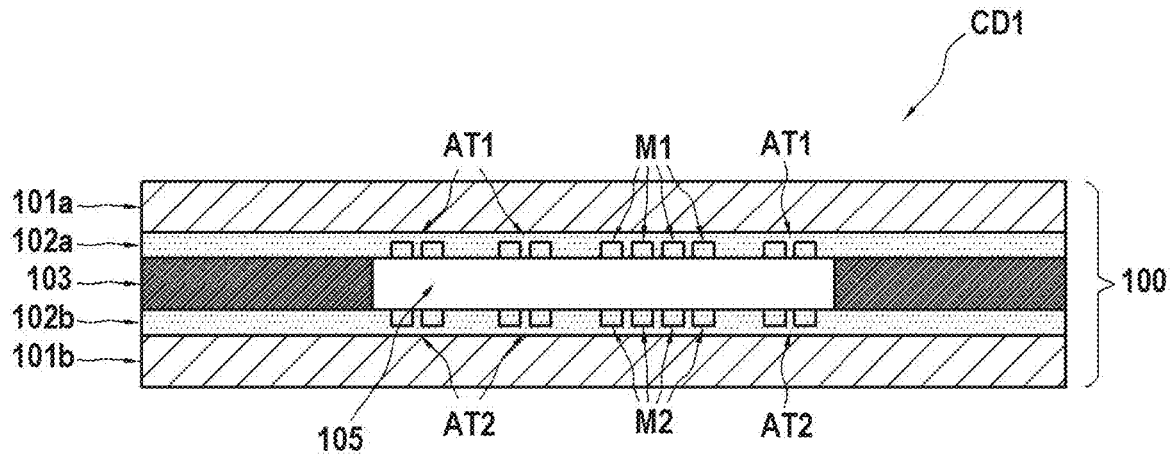
FIG. 2b shows a side view of the assembled layers of a smartcard according to some embodiments of the invention.

The windings AT1 and AT2 of the antenna and also the patterns M1 and M2 are situated in a substrate, which is itself situated in a recess in the metal region. The different layers of the card CD1 are illustrated in more detail in FIGS. 2a and 2b. One or more transparent layers, for example protection layers, may also be present on the metal layer, as shown in FIGS. 2a and 2b.

The patterns M1 and M2 comprise circular metal traces centred on the centre of the windings of the antenna. The pattern moreover comprises a round central part $C_1$, made of conductive material (or $C'_1$ on the other face). Each of the traces $T_{11}$, $T_{12}$ and $T_{13}$ (or $T'_{11}$, $T'_{12}$ and $T'_{13}$ on the other face) is insulated from the neighbouring trace by a noncon-ductive-material space, such as the substrate comprising the antenna and the pattern. Furthermore, each of the traces does not form a closed circular surface and is opened by a space $P_2$ connecting the centre $C_1$ to the substrate included between the pattern and the antenna. Thus, the conductive-material traces are remote from one another in order to allow a magnetic field to pass through said antenna and are configured so as not to form a closed loop, in order to prevent the formation of Foucault currents on the card CD1. The conductive-material pattern forms a capacitive circuit. It is configured such that the capacitance formed by the pattern, which is associated with the capacitance of said antenna, allows the resonant circuit formed by the antenna and the pattern to resonate at a determined communication frequency.

According to some embodiments, on a first face of the card, the radius of the circle made up of the most internal coil of the winding AT1 is 11.51 mm and that of the most external coil is 12.12 mm. On a second face, these radii, for the winding AT2, are 11.31 mm and 12.32 mm, respectively. The area situated inside the internal coil of the winding AT1 or AT2 may be substantially equal to 387 mm$^2$.

Thus, the two windings AT1 and AT2 may not be super-posed exactly, one on each side of the card, but may be slightly offset.

FIGS. 2a and 2b show an exploded view and an assembled view, respectively, of a smartcard 1 according to an embodiment of the invention.

In the given examples, the smartcard is in the format ID1 of a credit card, although other forms are possible to implement the invention.

In FIG. 2a, it is possible to see a first plastics material layer 101a and a second plastic layer 101b, one of the objectives of which is to protect the internal layers of the smartcard CD1. The layers 101a and 101b, which are optional, are made from polycarbonate, for example, and are preferably transparent.

Deposited under the layers 101a and 101b are resin layers 102a and 102b, respectively. One of the objectives of the resin layers is to seal the internal layers of the smartcard CD1.

The smartcard CD1 is formed by or comprises a metal layer 103 comprising a recess region 104 that accommodates (inserted) a substrate 105. The recess region 104 is an opening or a passage region made in the metal layer 103 in order to allow the antenna AT1 and possibly the antenna AT2 to be positioned (the antenna AT2 being connected to the antenna AT1).

The shape and dimensions of this recess region 104 can be adapted as appropriate. By way of example, the recess region 104 is rectangular. This metal layer 103 may be made up of a single metal, such as stainless steel or aluminium, for example, or of an alloy of multiple different metals. The metal layer 103 can comprise a plurality of metal sublayers.

According to one particular example, the card body 100 and more generally the smartcard CD1 is devoid of ferrite, allowing manufacture of the card to be simplified.

Figure 3:
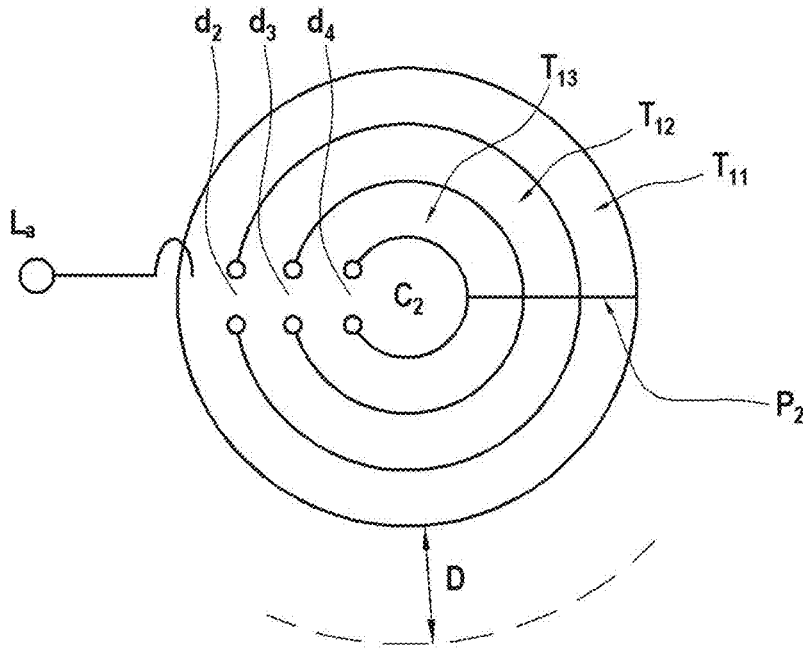
FIG. 3 shows an example of a pattern according to a first embodiment of the invention.
Figure 4:
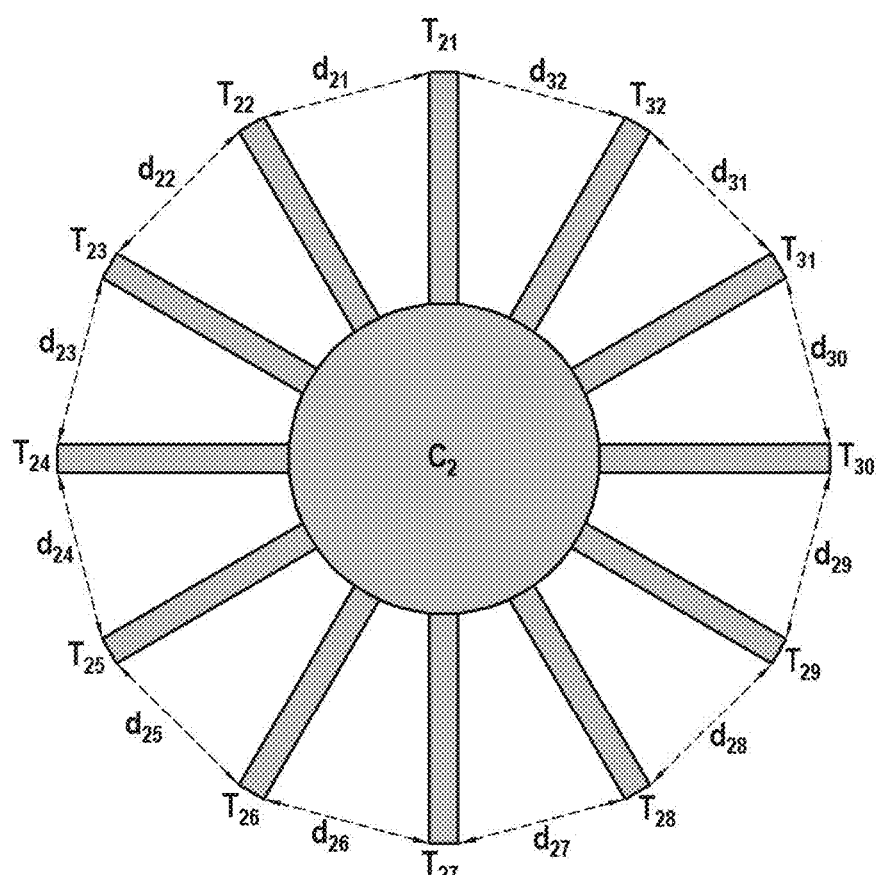
FIG. 4 shows an example of a pattern according to a second embodiment of the invention.
Figure 5:
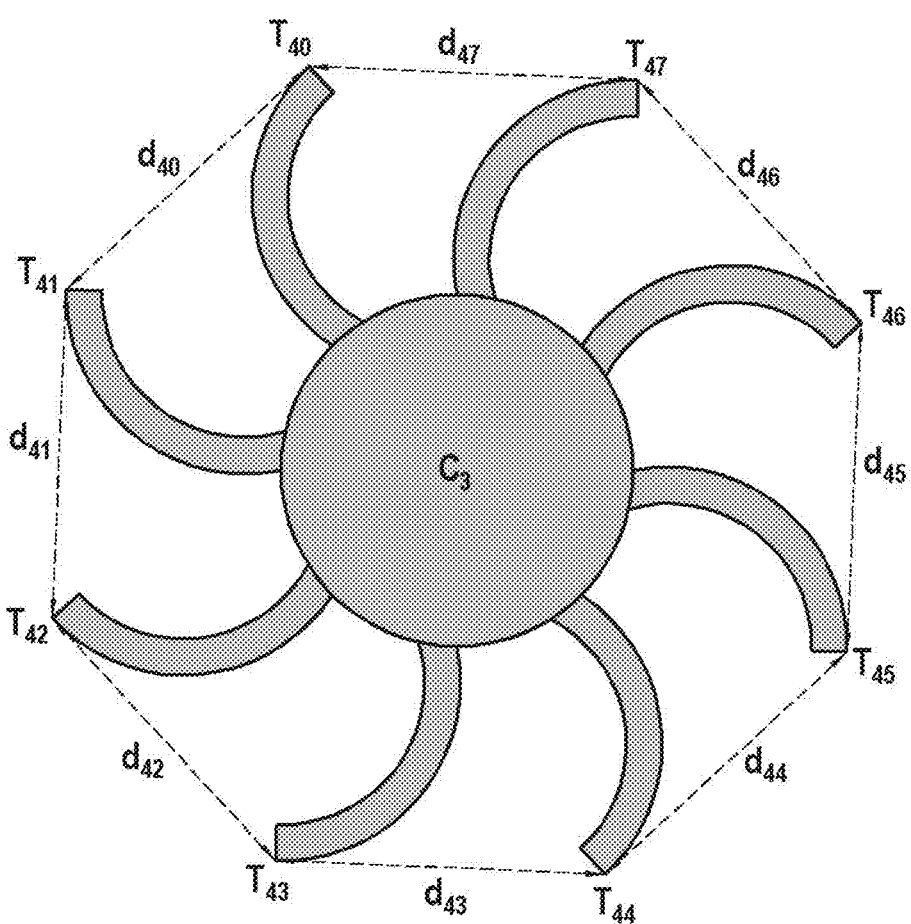
FIG. 5 shows an example of a pattern according to a third embodiment of the invention.

An antenna AT1 and also a conductive-material pattern M1 as disclosed by the embodiments of the present invention, for example with reference to FIGS. 3, 4 and 5, are arranged on a substrate 105. As illustrated in FIG. 2a, the card CD1 may be equipped with an antenna comprising a first winding denoted by AT1 and a second winding denoted by AT2, a winding being present on each side of the substrate and therefore on each face of the smartcard CD1, the two windings being physically connected by a via (or a metal perforation) and two conductive-material patterns M1 and M2, a pattern being respectively physically connected to each winding. The presence of a winding on each of the faces allows the best use of the surface available on the substrate and therefore optimization of the energy harnessed in the ambient electromagnetic radiation; the number of coils on each of the faces of the substrate is advantageously between two and five, amounting to occupation of only a modest fraction of the surface of the support near its contour, typically between 5 and 10% of this surface.

In FIG. 2b, it is possible to see a side view of the smartcard CD1, the layers mentioned with reference to FIG. 2a being assembled to form the smartcard. During assembly of the card CD1, the resin 102a follows the surface between the assembly formed by the metal layer 103 and the substrate 105 and the plastic layer 101a.

It is thus seen that the conductive-material pattern placed at the centre of the antenna allows the space that would exist in its absence in the centre of the antenna to be filled and thus allows better adhesion of the layers, for example during application of a layer of resin. Thus, the card has a surface whose structural homogeneity is improved, thus making it more robust. In other words, the pattern allows better filling of the central part of the antenna on each side of the PCB, providing greater homogeneity during application of the resin and therefore allowing these structural problems to be avoided.

Of course, the smartcard CD1 can comprise other elements or layers, which are not shown in the figures. The smartcard CD1 can in particular comprise an RF chip, RF signifying radio frequency throughout the description. The RF chip is configured to set up a contactless communication with an external terminal (not shown) by using the antenna included in the smartcard. To do this, the RF chip is electrically connected to the antenna AT1 (and to the antenna AT2 if present).

Thus, the present invention relates to a smartcard comprising:

a card body formed at least in part by a metal layer comprising a recess region and at least two plastics layers on either side of the metal layer;

at least one RF antenna arranged in or opposite the recess region;

a module comprising an RF chip, the module being positioned in a cavity that passes through a plastics layer and being electrically connected to the RF antenna;

a conductive-material pattern that is connected in parallel with said at least one antenna and arranged in or opposite the recess region and comprises a central region, the conductive surface area of which is less than or equal to 20% of the surface area of a central region contained by said antenna at least two conductive-material traces that are separated from one another and extend from said central region of said pattern, said at least two metal traces being remote from one another in order to allow a magnetic field to pass through said antenna and being configured so as not to form a closed loop, in order to prevent the formation of Foucault currents on said card, said conductive-material pattern being configured to form a capacitance that is electrically connected to the antenna, the value of which is determined so that the capacitance formed by said pattern, which is associated with the capacitance of said antenna, allows the resonant circuit formed by the antenna and said pattern to resonate at a determined communication frequency.

Preferably, all the traces of a pattern are situated in the same horizontal plane compared with the faces of the smartcard.

In FIGS. 2a and 2b, it can be seen that the conductive-material pattern (each conductive-material pattern on each side of the card) is positioned at the centre of the antenna, and made up of at least two metal traces. It is seen in FIGS. 2 and 2b that the conductive-material pattern comprises four conductive-material traces, for example.

The formation of the pattern in the form of traces can help not to disrupt the magnetic field and thus not to change the operation of the antenna.

FIGS. 3, 4 and 5 can be used to illustrate examples of conductive-material patterns, M1 or M2, the features of which allow better homogeneity of the card to be ensured while not disrupting, or even while improving, the performance of the antenna.

The patterns in FIGS. 3, 4 and 5 are such that they take up between 60 and 90% of the surface created at the centre of the antenna, that is to say of the surface delimited by the internal coil of the antenna.

The pattern consists of at least two conductive traces having at least one space between them and at least one space with the most internal/closest coil of the antenna, on each side of the substrate. More than two traces can be used, provided that each pair is separated by a space. All of the traces on each side of the substrate represent a continuous electroplated surface. The conductive traces of each pattern are configured to avoid forming a loop, in order to prevent the formation of Foucault currents in this metal shape addressing the incident magnetic field.

Moreover, the central part of the pattern, shown in FIGS. 3, 4 and 5 by the references $C_1$, $C_2$ and $C_3$, respectively, takes up a surface area less than or equal to 20% of the surface area delimited by the internal coil of the antenna and included inside this coil.

The central part of each pattern can consist of a continuous metal patch (or surface) having a surface area of less than 20% of the internal surface area defined by the surface included inside the most internal coil of the antenna, in order to render losses related to the Foucault current insignificant.

By forming the conductive-material pattern using separated conductive traces, which may be interwoven, the induced magnetic field lines can pass through the antenna without changing the magnetic field, and therefore the behaviour of the antenna is not changed. Furthermore, the use of patterns whose conductive traces do not form a closed loop allows a reduction in the effects of Foucault currents, the effects of which will be insignificant.

The conductive-material pattern brings an additional capacitance to the capacitance of the antenna, increasing the total capacitance of the antenna. Thus, for the same desired resonant frequency, the diameter of the most internal coil of the antenna is greater, with a reduced number of coils and the same antenna pitch as for an antenna without this conductive-material pattern of the prior art, while maintaining a low resistance.

The features of the capacitance added in this manner, in particular the spacing between the traces, the shape of the pattern (width, length, shape and number of traces) are chosen so that this capacitance defines, with the antenna and the chip, a given resonant frequency, which is chosen on the basis of the needs of the card and in particular the standards with which the card has to comply.

Figure 6:
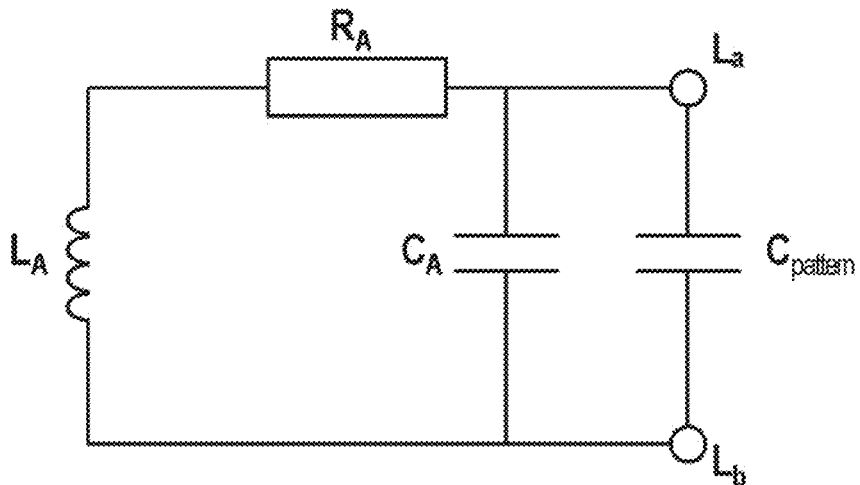
FIG. 6 shows an equivalent circuit diagram for the antenna according to some embodiments of the invention.

For reasons of clarity, FIGS. 3, 4 and 5 show the pattern of the antenna on a single face of the card CD1. It will be possible to easily reproduce the pattern on the other face, the two patterns being opposite one another on each of the faces. Moreover, it is understood that the two patterns are electrically connected to one another, for example using vias and/or by way of the electrical connection to the antenna, the coils of the antenna AT1 being connected to the coils of the antenna AT2, by way of vias. The patterns are connected to the antenna by way of the terminals La and Lb, which are illustrated in FIG. 6 on the equivalent circuit diagram for the antenna.

FIG. 3 shows a first example of a conductive-material pattern positioned at the centre of the antenna, on each side of the substrate. Only one face is shown, and therefore a single one of the two patterns is shown.

In accordance with the embodiment in FIG. 3, the at least one antenna comprises a plurality of coils, the central region of the pattern is round and centred on the centre of the coils of the antenna, and the traces of the pattern are circular traces centred on the centre of the coils and forming rings around the round central region of the pattern, the traces each being separated from one another by first nonconductive circular regions extending between each of the circular traces and a second rectilinear region connecting the first nonconductive circular regions and interrupting each of the conductive circular traces of the pattern so as not to form a closed loop, in order to prevent the formation of Foucault currents on the card, the first nonconductive circular regions each being open so as to ensure a conductive continuity between the central region and the traces of the pattern.

The pattern comprises three conductive metal traces $T_{11}$, $T_{12}$, $T_{13}$. The three metal traces are circular traces, which follow the shape of the coils of the antenna, that is to say that the centre of the traces is the same or nearly the same as the centre of the coils of the antenna. The trace $T_{11}$, which is the outer trace of the pattern, closest to the coils, is preferably situated at a distance D from the most internal coil of the antenna. The minimum distance D may be dependent on the technology used and may be calculated so as to prevent a short circuit between the pattern and the coil of the antenna.

According to some embodiments, the distance D is between 200 μm and 1 mm.

The three traces are connected to one another and connected to the centre $C_1$. They are separated by a nonconductive-material space, referred to as insulating space, (such as the substrate), except over a part of their circumference, in order to allow an electrical continuity between the traces and the centre. The nonconductive-material space partially separating them connects the spaces that are present between all of the traces to the nonconductive region situated between the antenna (its most internal winding) and the most external trace of the pattern. In other words, a circular trace is separated from the adjacent trace(s) by a circular insulating space that follows the circumference of the traces, except over a portion of its circumference, leaving an opening connecting the traces to one another and connecting them to the centre of the pattern. This opening may have a width $d_2$ of 200 μm, for example.

The conductive opening left between the traces and the centre of the pattern may, for example, be situated diametrically opposite the insulating space joining the centre of the pattern to the nonconductive region situated between the antenna (its most internal winding) and the most external trace of the pattern.

It may be noted that this opening may differ for each trace.

According to some embodiments, the distance $d_2$ is determined to allow an open circuit to be maintained. The distances $d_2$, $d_3$, $d_4$ may be the same or all different. Taking identical distances $d_2$, $d_3$ and $d_4$ helps to improve mechanical strength because the symmetry is better and can also facilitate the method for manufacturing the printed circuit, in particular in chemical etching baths.

The trace $T_{11}$, the most external trace, is connected to a terminal $L_a$ of the antenna. When the other face of the card comprises a second pattern opposite the pattern as described, this second pattern resembles the pattern described and connected to a second terminal $L_b$ of the antenna, more precisely of the winding of the antenna that is present on this second face of the card CD1.

FIG. 4 shows a second example of a conductive-material pattern positioned at the centre of the antenna, on each side of the substrate. Only one face is shown, and therefore only one of the two patterns is shown.

According to this embodiment, the pattern comprises at least twelve conductive-material traces or conductive traces $T_{21}$, $T_{22}$, $T_{23}$, $T_{24}$, $T_{25}$, $T_{26}$, $T_{27}$, $T_{28}$, $T_{29}$, $T_{30}$, $T_{31}$, $T_{32}$. The twelve conductive traces are connected to one another, at one of their ends, by way of a central conductive surface $C_2$, said surface being able to be a round surface, the surface area of which is at most equal to 20% of the size of the surface area delimited by the internal coil of the antenna and included inside this coil. According to other embodiments, this central surface can have a shape other than round, for example elliptical, square, rectangular. This central surface $C_2$ can be metallic.

The distances $d_{21}$, $d_{22}$, $d_{23}$ . . . to $d_{32}$ are the same or different and represent the spacing between the traces. According to some embodiments, the distances $d_{21}$ to $d_{32}$ are the same and, according to some embodiments, they are different. Taking identical distances $d_{21}$ to $d_{32}$ helps to improve mechanical strength because the symmetry is better and can also facilitate the method for manufacturing the printed circuit, in particular in chemical etching baths.

It is advantageous to take fine traces (also called strands), of an order of magnitude of 200 μm. This can help to reduce Foucault currents in each strand. However, the finer the strands, the greater the number of strands needs to be in order to achieve a desired capacitance value. Thus, the size and number of strands can be determined on the basis of the capacitance value to be obtained.

The twelve traces $T_{21}$, $T_{22}$, $T_{23}$, $T_{24}$, $T_{25}$, $T_{26}$, $T_{27}$, $T_{28}$, $T_{29}$, $T_{30}$, $T_{31}$, $T_{32}$ can be of the same length or of different length. When the traces are of the same length, the resin creep is advantageously improved by making it more homogeneous.

The twelve traces are rectangular. They are configured to form a surface according to a target capacitance value.

The end of the traces that is not connected to the central surface is free and situated at a distance D' from the internal coil of the antenna. The minimum distance D' can depend on the technology used and can be calculated so as to avoid a short circuit between the pattern and the coil of the antenna.

FIG. 5 shows a third example of a conductive-material pattern positioned at the centre of the antenna, on each side of the substrate. Only one face is shown, and therefore only one of the two patterns is shown.

According to this embodiment, the conductive-material pattern comprises at least 8 conductive traces $T_{40}$, $T_{41}$, $T_{42}$, $T_{43}$, $T_{44}$, $T_{45}$, $T_{46}$, $T_{47}$. The eight conductive traces are connected to one another, at one of their ends, by way of a central conductive surface $C_3$, said surface being able to be a round surface, the surface area of which is at most equal to 20% of the size of the surface area delimited by the internal coil of the antenna and included inside this coil. According to other embodiments, this central surface can have a shape other than round, for example elliptical, square, rectangular. This central surface $C_3$ can be metallic.

The distances $d_{40}$, $d_{41}$, $d_{42}$ . . . to $d_{47}$ are the same or different and represent the spacing between the traces. According to some embodiments, the distances $d_{31}$ to $d_{38}$ are the same and, according to some embodiments, they are different. Taking identical distances $d_{40}$ to $d_{47}$ helps to improve mechanical strength because the symmetry is better and can also facilitate the method for manufacturing the printed circuit, in particular in chemical etching baths.

It is advantageous to take fine traces (also called strands), of an order of magnitude of 200 μm. This can help to reduce Foucault currents in each strand. However, the finer the strands, the greater the number of strands needs to be in order to achieve a desired capacitance value. Thus, the size and number of strands can be determined on the basis of the capacitance value to be obtained.

The at least 8 conductive traces $T_{40}$, $T_{41}$, $T_{42}$, $T_{43}$, $T_{44}$, $T_{45}$, $T_{46}$, $T_{47}$ can be of the same length or of different length. When the traces are of the same length, the resin creep is advantageously improved by making it more homogeneous.

The twelve traces are rectangular. They are configured to form a surface according to a target capacitance value.

The end of the traces that is not connected to the central surface is free and situated at a distance D" from the internal coil of the antenna. The minimum distance D" can depend on the technology used and can be calculated so as to avoid a short circuit between the pattern and the coil of the antenna.

FIG. 6 shows an example of an equivalent circuit diagram for the antenna as proposed according to the different embodiments of the invention.

The inductance $L_a$ and the capacitance $C_a$ of the antenna and an additional capacitance $C_{pattern}$ corresponding to the capacitor formed by the metal traces of the pattern can be seen therein. The resonant circuit RLC thus made up of the resistance Ra, the impedance $L_a$ and the capacitances $C_a$ and $C_{pattern}$ allows the resonant frequency of the antenna to be adapted so that it is, for example, equal to 13.56 MHZ, thereby allowing RFID-type communication in contactless mode with an external reader, according to one of the standards ISO 14443, ISO 10373, ISO 18745, ISO 15693, EMVCo. FIG. 6 reveals that the conductive-material patterns are connected to $L_a$ and $L_b$.

Advantageously, as mentioned previously, the antenna can comprise coils arranged on each face of the substrate, and, therefore, vias allow the coils to be connected from one face to the other, in which case reference can be made to two antennas AT1 and AT2. This allows a continuity in the loops formed by these coils. The connecting points $L_a$ and $L_b$ can therefore be on either side of the substrate.

To obtain a resonant frequency of 13.75 MHZ, an inductance value LA of 1.29 μH, a resistance value RA of 4.76 ohms, a capacitance value CA of 1 to 2 pF and a capacitance value $C_{pattern}$ of 54.23 pF can be chosen. The capacitance of the RF chip, of the order of 50 pF, is moreover added to these two capacitances.

Figure 7:
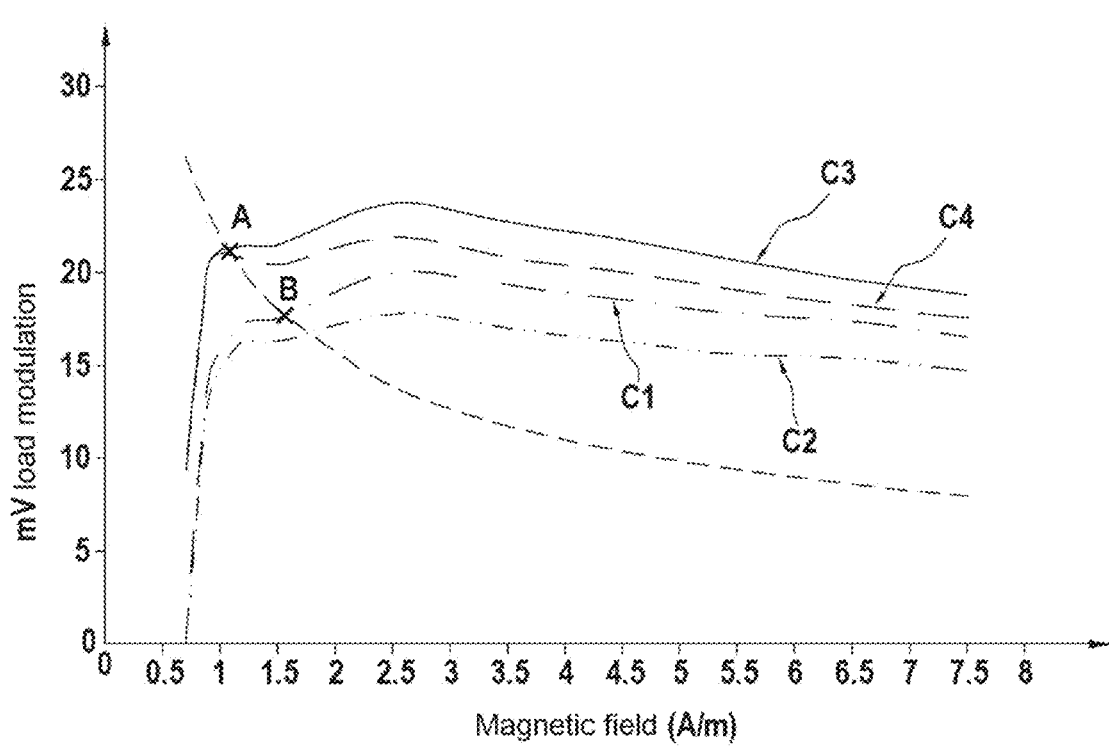
FIG. 7 shows a comparison between a response curve obtained according to the prior art and according to an embodiment of the present invention.

FIG. 7 shows a comparison between a response curve obtained according to the prior art and according to an embodiment of the present invention. More precisely, the curves show a comparison between the reaction time of the card without the invention (curves C1 and C2) and with the embodiment of the conductive-material pattern implemented in FIG. 3 (curves C3 and C4). An ISO reference curve showing the reference values demanded by the standard ISO 14443-2 is also shown in the figure. A high curve (C1 or C3) and a low curve (C2 or C4) illustrate the high and low terminals, respectively, between which the load modulation amplitude is situated.

It is therefore seen that the conductive-material pattern can improve the reaction time. Thus, it is seen that the load modulation amplitude demanded by the standard ISO 14443-2 is attained:

for a magnetic field of 1.1 amps per metre, represented by point A on the curve for a card CD1 according to the embodiment of FIG. 3 and for a magnetic field of 1.5 amps per metre, represented by point B on the curve for a card that does not implement the present invention.

It can therefore be seen that the card implementing an embodiment of the present invention can allow activation of the card to be triggered firstly more rapidly and secondly with a greater load modulation amplitude than when the present invention is not implemented.

Figure 8:
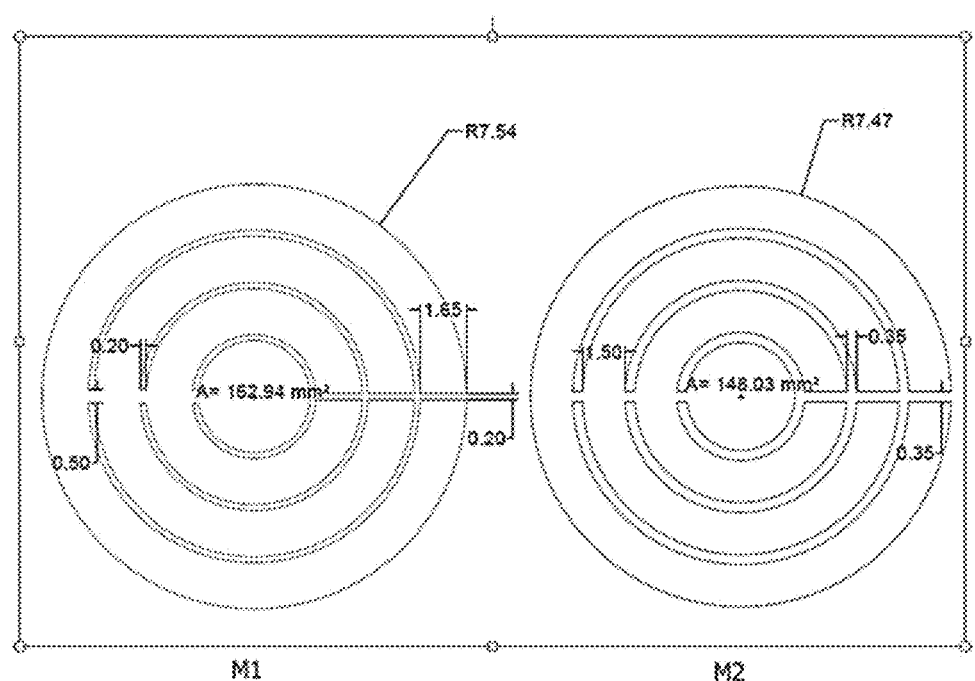
FIG. 8 shows an embodiment providing an example of the dimensions that can be used for the pattern.

FIG. 8 shows an embodiment of the patterns M1 and M2, each of which is situated on one face of the card CD1, and illustrates orders of magnitude for dimensions that can be used for the patterns M1 and M2 according to some embodiments of the invention, the patterns M1 and M2 being able to be patterns as shown in FIG. 3.

Examples of Dimensions of the Pattern M1

It may be noted that the distance $d_2$ (and also $d_3$ and $d_4$) can be 0.5 mm. The width of the traces can be 1.65 mm and the width of the space between the traces can be 0.2 mm. The full surface of the centre C1 has an area of 162.94 mm$^2$ and the value of $p_2$ is 0.20 mm. The external radius of the last trace is 7.54 mm.

Examples of Dimensions of the Pattern M2

It may be noted that the distance $d_2$ (and also $d_3$ and $d_4$) can be 0.35 mm. The width of the traces can be 1.50 mm and the width of the space between the traces can be 0.35 mm. The full surface of the centre C1 has an area of 148.03 mm$^2$ and the value of $p_2$ is 0.20 mm. The external radius of the last trace is 7.47 mm.

The production of a printed circuit has a certain tolerance depending on the technology used. As the capacitance added by the pattern synthesizes its capacitive value according to the permittivity of the substrate, its thickness and the surface area of the electrical plates opposite one another, the dimensions of the pattern are chosen to be slightly wider on one layer than on the other (that is to say the dimensions of M1 compared to M2) in order to provide a precise surface area for the plates of the capacitance and therefore to be able to get around the effect of the tolerance and the precision of the technology used for the printed circuit.

Figure 9:
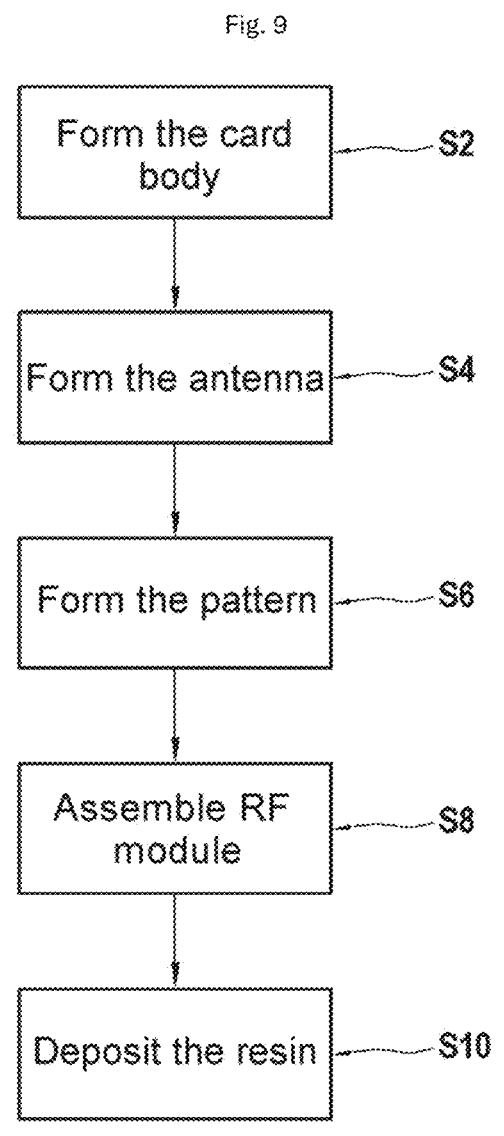

FIG. 9 schematically shows a method for manufacturing one of the smartcards CD1 described hereinabove, according to at least one particular embodiment. The description hereinabove of the smartcard CD1 according to various embodiments with reference to FIGS. 2 to 5 applies by analogy to the method of manufacture illustrated in FIG. 9.

During a providing step S2, a card body 100 comprising a metal layer 103 as described previously is formed (or provided). In particular, this card body 6 is formed at least in part by a metal layer 103, this metal layer 103 comprising a recess region 104, as already described.

During a forming step S4, an RF antenna is formed (or assembled) on or in the card body 100 in or opposite the recess region 104 of the metal layer 103, as already described. According to some embodiments, the RF antenna can comprise a first winding of coils and a second winding of coils, the two windings being formed (or assembled) opposite one another. As the antenna insert is made up of a printed circuit, this circuit is produced using conventional printed circuit technology on a dielectric substrate such as, for example, the material FR4. The antenna traces in this case are produced using a conventional subtractive printed circuit process (mechanical or chemical etching) with optional electroplated or electrolysis-free metal growth in order to obtain a certain thickness.

During a step S6, a conductive-material pattern is formed at the centre of the antenna or more exactly in a surface situated at the centre of the antenna. When the antenna comprises two windings of coils, a first and a second pattern are deposited opposite one another on either side of the substrate 105, in a region situated at the centre of the antenna windings, the most internal coil of the winding defining a central circle without a coil. The traces of the conductive-material pattern in this case are produced using a conventional subtractive printed circuit process (mechanical or chemical etching) with optional electroplated or electrolysis-free metal growth in order to obtain a certain thickness.

During a step S8, an RF chip is assembled so that the RF chip is electrically connected to the RF antenna.

The conventional process for manufacturing the card CD1 therefore comprises at least one process of depositing a layer of resin, or of filling, step S10, the region of the cavity situated above the antenna, in order to provide a seal between these two mechanically different elements, that is to say the substrate of the printed circuit and the metal layer that surrounds it. This sealing step is essential in order to provide the whole product with a monolithic appearance with a view to catering to a certain aesthetic look, but especially to provide the card with mechanical stability by preventing it from tearing during the various bending cycles throughout the life of the product. This is achieved in particular by virtue of the presence of the conductive-material pattern according to any one of the embodiments of the invention, allowing the surface area left empty at the centre of the antenna to be decreased.

The method can moreover comprise an additional step (not shown) of depositing a plastic layer for protecting the card, represented by the layer(s) 101a and 101b in FIGS. 2a and 2b. This layer is a polycarbonate layer, for example. In other embodiments, this layer can be PVC, PETF or other polymers.

A person skilled in the art will understand that the embodiments and variants described heretofore merely constitute nonlimiting examples of implementation of the invention. In particular, a person skilled in the art will be able to envisage any adaptation or combination of the embodiments and variants described heretofore in order to meet a quite particular need in accordance with the claims presented hereinafter.

The invention claimed is:

1. A smart card comprising:
a card body formed at least in part by a metal layer comprising a recess region and at least two plastics layers on either side of the metal layer;
at least one radiofrequency (RF) antenna arranged in or opposite the recess region;
a module comprising an RF chip, the module being positioned in a cavity that passes through a plastics layer and being electrically connected to the at least one RF antenna; and a conductive-material pattern that is connected in parallel with said at least one RF antenna and arranged in or opposite the recess region and comprises:

a central region, a conductive surface area of the conductive surface area being less than or equal to 20% of a surface area of the central region contained by said at least one RF antenna, and at least two conductive-material traces that are separated from one another and extend from said central region of said conductive-material pattern, said at least two conductive-material traces being remote from one another in order to allow a magnetic field to pass through said at least one RF antenna and being configured so as not to form a closed loop, in order to prevent formation of Foucault currents on said smart card, said conductive-material pattern being configured to form a connected capacitance that is electrically connected to the at least one RF antenna, a value of the connected capacitance being such that the connected capacitance formed by said conductive-material pattern, which is associated with a capacitance of said at least one RF antenna, allows a resonant circuit formed by the at least one RF antenna and said conductive-material pattern to resonate at a determined communication frequency.

2. The smart card according to claim 1, wherein said at least one RF antenna comprises two RF windings that are electrically connected to one another and respectively situated on either side of said recess region, two conductive-material patterns being respectively situated on either side of said recess region and each connected to one of the two RF windings.

3. The smart card according to claim 2, wherein said determined communication frequency is 13.56 MHz and conforms to standard ISO 14443-2 or ISO 10373-6.

4. The smart card according to claim 2, wherein the at least one RF antenna comprises a plurality of coils, the central region of said conductive-material pattern is round and centred on a centre of the coils of the antenna, and the at least two conductive-material traces of said conductive-material pattern are circular traces centred on the centre of the coils and forming rings around the central region of the conductive-material pattern, the at least two conductive-material traces each being separated from one another by first nonconductive circular regions extending between each of the circular traces and a second rectilinear region connecting said first nonconductive circular regions and interrupting each of the circular traces of said conductive-material pattern so as not to form a closed loop, in order to prevent the formation of Foucault currents on said smart card, the first nonconductive circular regions each being open to ensure a conductive continuity between the central region and the at least two conductive-material traces of said conductive-material pattern.

5. The smart card according to claim 2, the at least one RF antenna comprises a plurality of coils, said conductive-material pattern further comprises a round conductive central surface centred on a centre of the coils of the antenna and interconnecting a plurality of pairs of conductive-material traces, said at least two conductive-material traces being rectangular, connected to said round conductive central surface by one of their ends, the other end being free, and uniformly distributed around said central region of the conductive-material pattern.

6. The smart card according to claim 2, wherein a number of the at least two conductive-material traces depends on the value of the connected capacitance.

7. The smart card according to claim 2, wherein the at least two conductive-material traces have a width that is configured to reduce the Foucault currents present on said smart card.

8. The smart card according to claim 1, wherein said determined communication frequency is 13.56 MHz and conforms to standard ISO 14443-2 or ISO 10373-6.

9. The smart card according to claim 8, wherein the at least one RF antenna comprises a plurality of coils, the central region of said conductive-material pattern is round and centred on a centre of the coils of the antenna, and the at least two conductive-material traces of said conductive-material pattern are circular traces centred on the centre of the coils and forming rings around the central region of the conductive-material pattern, the at least two conductive-material traces each being separated from one another by first nonconductive circular regions extending between each of the circular traces and a second rectilinear region connecting said first nonconductive circular regions and interrupting each of the circular traces of said conductive-material pattern so as not to form a closed loop, in order to prevent the formation of Foucault currents on said smart card, the first nonconductive circular regions each being open to ensure a conductive continuity between the central region and the at least two conductive-material traces of said conductive-material pattern.

10. The smart card according to claim 8, wherein a number of the at least two conductive-material traces depends on the value of the connected capacitance.

11. The smart card according to claim 8, wherein the at least two conductive-material traces have a width that is configured to reduce the Foucault currents present on said smart card.

12. The smart card according to claim 1, wherein the at least one RF antenna comprises a plurality of coils, the central region of said conductive-material pattern is round and centred on a centre of the coils of the antenna, and the at least two conductive-material traces of said conductive-material pattern are circular traces centred on the centre of the coils and forming rings around the central region of the conductive-material pattern, the at least two conductive-material traces each being separated from one another by first nonconductive circular regions extending between each of the circular traces and a second rectilinear region connecting said first nonconductive circular regions and interrupting each of the circular traces of said conductive-material pattern so as not to form a closed loop, in order to prevent the formation of Foucault currents on said smart card, the first nonconductive circular regions each being open to ensure a conductive continuity between the central region and the at least two conductive-material traces of said conductive-material pattern.

13. The smart card according to claim 1, wherein the at least one RF antenna comprises a plurality of coils, said conductive-material pattern further comprises a round conductive central surface centred on a centre of the coils of the antenna and interconnecting a plurality of pairs of conductive-material traces, said at least two conductive-material traces being rectangular, connected to said round conductive central surface by one of their ends, the other end being free, and uniformly distributed around said central region of the conductive-material pattern.

14. The smart card according to claim 13, wherein the at least two conductive-material traces are uniformly distributed around the round conductive central surface.

15. The smart card according to claim 1, wherein
the at least one RF antenna comprises a plurality of coils,
said conductive-material pattern comprises a round conductive central surface centred on a centre of the coils of the antenna and interconnecting a plurality of pairs of conductive-material traces,
said at least two conductive-material traces being helical, connected to said round conductive central surface by one of their ends, the other end being free, and uniformly distributed around said central region of the conductive-material pattern.

16. The smart card according to claim 2, wherein
the at least one RF antenna comprises a plurality of coils,
said conductive-material pattern comprises a round conductive central surface centred on a centre of the coils of the antenna and interconnecting a plurality of pairs of conductive-material traces,
said at least two conductive-material traces being helical, connected to said round conductive central surface by one of their ends, the other end being free, and uniformly distributed around said central region of the conductive-material pattern.

17. The smart card according to claim 15, wherein the at least two conductive-material traces are uniformly distributed around the round conductive central surface.

18. The smart card according to claim 1, wherein a number of the at least two conductive-material traces depends on the value of the connected capacitance.

19. The smart card according to claim 1, wherein the at least two conductive-material traces have a width that is configured to reduce the Foucault currents present on said smart card.

20. A method for manufacturing a smart card that is formed at least in part by a card body comprising a metal layer, said metal layer comprising a recess region, the method comprising:

forming, on or in the card body, at least one first radiofrequency (RF) antenna in or opposite the recess region of the metal layer;

forming at least one conductive-material pattern at a centre of the at least one first RF antenna connected in parallel with said at least one first RF antenna and arranged in or opposite the recess region, the at least one conductive-material pattern comprising:

a central region, a conductive surface area of the central region being less than or equal to 20% of a surface area of the central region contained by said at least one first RF antenna, at least two conductive-material traces that are separated from one another and extend from said central region of said at least one conductive-material pattern, said at least two conductive-material traces being remote from one another in order to allow a magnetic field to pass through said at least one first RF antenna and being configured so as not to form a closed loop, in order to prevent formation of Foucault currents on said smart card, said at least one conductive-material pattern being configured to form a connected capacitance that is electrically connected to the at least one first RF antenna, a value of the connected capacitance being determined so that the connected capacitance formed by said at least one conductive-material pattern, which is associated with a capacitance of said at least one first RF antenna, allows a resonant circuit formed by the at least one first RF antenna and said at least one conductive-material pattern to resonate at a determined communication frequency;

assembling an RF chip so that said RF chip is electrically connected to said at least one first RF antenna; and depositing a layer of resin in order to seal the metal layer and the recess region comprising said at least one first RF antenna and said at least one conductive-material pattern.

* * * * *